US011756772B2

(12) United States Patent
Sporleder et al.

(10) Patent No.: US 11,756,772 B2
(45) Date of Patent: Sep. 12, 2023

(54) SYSTEM AND METHOD FOR EXTENDING A LIFETIME OF AN ION SOURCE FOR MOLECULAR CARBON IMPLANTS

(71) Applicant: Axcelis Technologies, Inc., Beverly, MA (US)

(72) Inventors: David Sporleder, Billerica, MA (US); Neil Bassom, Hamilton, MA (US); Neil K. Colvin, Merrimack, NH (US); Mike Ameen, Newburyport, MA (US); Xiao Xu, Needham, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 288 days.

(21) Appl. No.: 16/887,571

(22) Filed: May 29, 2020

(65) Prior Publication Data

US 2020/0388468 A1     Dec. 10, 2020

Related U.S. Application Data

(60) Provisional application No. 62/857,883, filed on Jun. 6, 2019.

(51) Int. Cl.
*H01J 37/32* (2006.01)
*H01J 37/08* (2006.01)
*H01J 37/317* (2006.01)

(52) U.S. Cl.
CPC ........ *H01J 37/32504* (2013.01); *H01J 37/08* (2013.01); *H01J 37/3171* (2013.01); *H01J 37/3244* (2013.01); *H01J 2237/006* (2013.01)

(58) Field of Classification Search
CPC .... H01J 27/022; H01J 37/32504; H01J 37/08; H01J 37/3171; H01J 37/3244; H01J 2237/006
See application file for complete search history.

(56) References Cited

U.S. PATENT DOCUMENTS 8,343,860 B1 * 1/2013 Omarjee .......... H01L 21/26566
438/513
8,350,236 B2    1/2013 Lee
(Continued)

OTHER PUBLICATIONS

International Search Report and Written Opinion dated Sep. 15, 2020 in connection with International Application No. PCT/US2020/035723.

*Primary Examiner* — David E Smith
(74) *Attorney, Agent, or Firm* — Eschweiler & Potashnik, LLC

(57) ABSTRACT

An ion source assembly and method has a source gas supply to provide a molecular carbon source gas to an ion source chamber. A source gas flow controller controls flow of the molecular carbon source gas to the ion source chamber. An excitation source excites the molecular carbon source gas to form carbon ions and radicals. An extraction electrode extracts the carbon ions from the ion source chamber, forming an ion beam. An oxidizing co-gas supply provides oxidizing co-gas to chamber. An oxidizing co-gas flow controller controls flow of the oxidizing co-gas to the chamber. The oxidizing co-gas decomposes and reacts with carbonaceous residues and atomic carbon forming carbon monoxide and carbon dioxide within the ion source chamber. A vacuum pump system removes the carbon monoxide and carbon dioxide, where deposition of atomic carbon within the ion source chamber is reduced and a lifetime of the ion source is increased.

20 Claims, 6 Drawing Sheets

(56) References Cited

U.S. PATENT DOCUMENTS

| | | |
|---|---|---|
| 10,170,286 B2 | 1/2019 | Colvin |
| 2011/0021011 A1 | 1/2011 | Sweeney |
| 2012/0190181 A1 | 7/2012 | Lee |
| 2014/0374665 A1 | 12/2014 | Iwaya |
| 2015/0380212 A1 | 12/2015 | Byl |
| 2016/0215111 A1* | 7/2016 | Bilek .................... A61L 17/005 |
| 2017/0069499 A1* | 3/2017 | Sweeney ................. C23C 14/06 |
| 2018/0096828 A1* | 4/2018 | Colvin .............. H01J 37/32862 |

* cited by examiner

SYSTEM AND METHOD FOR EXTENDING A LIFETIME OF AN ION SOURCE FOR MOLECULAR CARBON IMPLANTS

REFERENCE TO RELATED APPLICATIONS

This application claims the benefit of U.S. Provisional Application No. 62/857,883 filed Jun. 6, 2019, entitled "SYSTEM AND METHOD FOR EXTENDING A LIFETIME OF AN ION SOURCE FOR MOLECULAR CARBON IMPLANTS", the contents of which are herein incorporated by reference in their entirety.

TECHNICAL FIELD

The present disclosure relates generally to semiconductor device fabrication and ion implantation, and more particularly to a method of improving performance and extending the lifetime of an ion source in an ion implanter configured for molecular carbon implantation.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type semiconductors, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

SUMMARY

The present disclosure overcomes the limitations of the prior art by providing a system, apparatus, and method for improving performance and extending the lifetime of an ion source in an ion implantation system for molecular carbon implants. Accordingly, the following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

Aspects of the disclosure facilitate ion implantation processes by removing carbonaceous material or residue generated from the disassociation and ionization of molecular carbon source gases which can accumulate on structures associated with the ion source, thereby poisoning the cathode and reducing the efficiency of the cathode. Additionally, carbonaceous residues can coat insulators and/or bridge insulating gaps resulting in electrical shorts and source failure. Thus, the lifetime of the ion source is increased by removing or reducing the amount of residue formed. Examples of associated apparatuses and ion implantation systems for carrying out the method are disclosed herein.

In accordance with one exemplary aspect, an ion source assembly is provided for improving the performance of an ion implanter. The ion source assembly comprises an ion source chamber and a source gas supply configured to provide a molecular carbon source gas to the ion source chamber. The molecular carbon source gas, for example, comprises toluene or another hydrocarbon source material. A source gas mass flow controller is provided and configured to control a flow of the molecular carbon source gas to the ion source chamber.

An excitation source, for example, is configured to excite the molecular carbon source gas, therein ionizing the parent molecule and forming byproducts as a result of dissociation of the molecular carbon source gas. Such byproducts include both ion and neutral fragments of the parent molecule. An extraction electrode is further configured to extract the carbon ions from the ion source chamber, therein forming an ion beam. A mass filter, for example, can be provided to separate the ions by their mass-to-charge ratio and to allow the desired ion species to pass while filtering out the remaining ion species.

In accordance with the disclosure, an oxidizing co-gas supply is provided and configured to provide a predetermined concentration of an oxidizing gas to the ion source chamber. An oxidizing gas mass flow controller, for example, is configured to control a flow of the oxidizing gas to the ion source chamber, wherein the oxidizing gas reacts with the carbonaceous residue within the ion source chamber therein forming additional byproducts within the ion source chamber, such as one or more of carbon dioxide, carbon monoxide, and water. A vacuum pump system is further provided and configured to remove the byproducts from the ion source chamber, wherein deposition of carbon within the ion source chamber is reduced and a lifetime of the ion source chamber is increased.

The molecular carbon source gas and the oxidizing gas are introduced simultaneously or sequentially into the ion source chamber. For example, the oxidizing gas can be utilized as a co-gas with the molecular carbon source gas concurrent with implantation, as a purge gas during times of non-implantation, or both. For example, carbon residues react with oxygen from the oxidizing gas forming carbon monoxide or carbon dioxide gases which are pumped away. Thus, the build-up of carbon material is minimized in the ion source chamber. An inert gas such as argon, for example, can be introduced to the ion source chamber, wherein the inert gas can further stabilize the plasma without significantly contributing to the chemical reaction, whereby oxidation of a cathode surface associated with a cathode of the ion source chamber can be generally prevented.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

Figure 1:
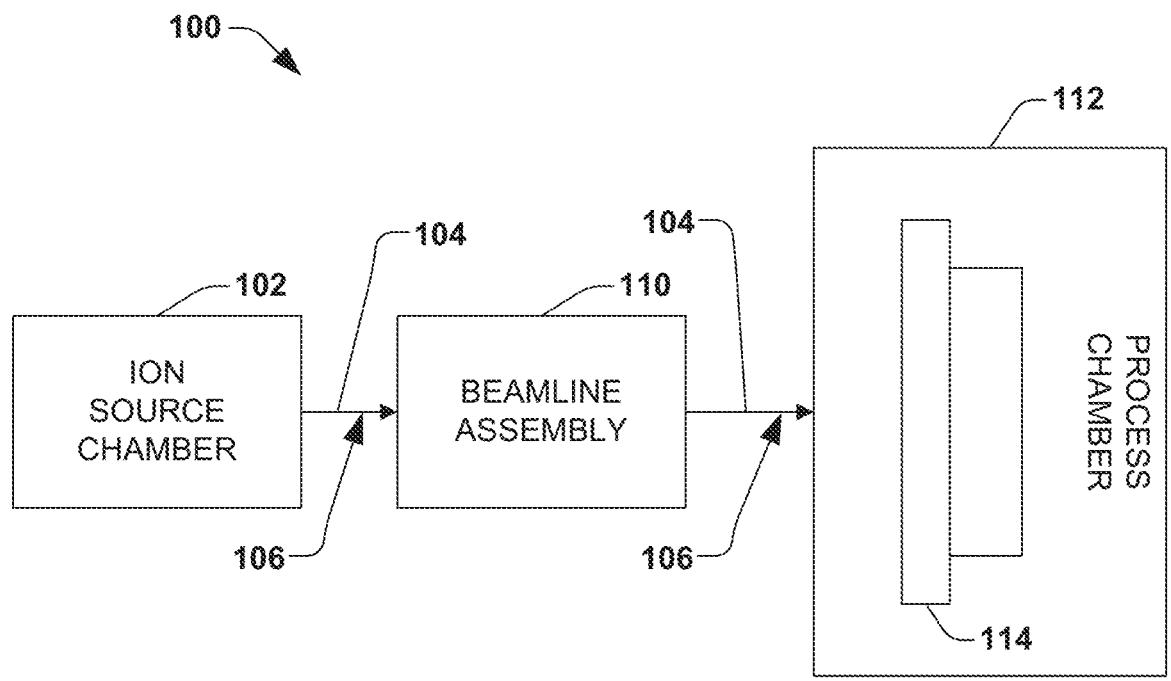
FIG. 1 is an ion implantation system suitable for implementing one or more aspects of the present disclosure in block diagram form.

The present disclosure is directed generally toward a system, apparatus, and method for minimizing carbon deposits in an ion source and increasing the lifetime of an ion source of an ion implantation system. Accordingly, the present disclosure will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present disclosure. It will be evident to one skilled in the art, however, that the present disclosure may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessary to scale with each other, and the placement of various elements in the drawings is chosen to provide a clear understanding of the respective embodiment and is not to be construed as necessarily being a representation of the actual relative locations of the various components in implementations according to an embodiment of the disclosure. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Ion implantation is a process that is employed in semiconductor device fabrication in which ions of one or more elements are accelerated into a workpiece in order to change the properties of the workpiece. For example, it is common for dopants such as boron, arsenic, and phosphorus to be implanted into silicon to modify its electrical properties. In an exemplary ion implantation process, an element or molecule of interest is ionized, extracted, and accelerated electrostatically to form a high energy ion beam, filtered by its mass-to-charge ratio, and directed to strike a workpiece. The ions physically bombard the wafer, enter the surface and come to rest below the surface, at a depth related to their energy.

Referring to FIG. 1, the system 100 includes an ion source 102 for producing an ion beam 104 along a beam path 106. A beamline assembly 110 is provided downstream of the ion source 102 to receive a beam therefrom. The beamline system 110 may include (not shown) a mass analyzer, an acceleration structure, which may include, for example, one or more gaps, and an angular energy filter. The mass analyzer includes a field generating component, such as a magnet, and operates to provide a field across the beam path 106 so as to deflect ions from the ion beam 104 at varying trajectories according to mass (e.g., mass-to-charge ratio). Ions traveling through the magnetic field experience a force which directs individual ions of a desired mass along the beam path 106 and which deflects ions of undesired mass away from the beam path.

A process chamber 112 is provided in the system 100, which contains a target location that receives the ion beam 104 from the beam line assembly 110 and supports one or more workpieces 114 such as semiconductor wafers along the beam path 106 for implantation using the final mass analyzed ion beam. The process chamber 112 then receives the ion beam 104 which is directed toward a workpiece 114. It is appreciated that different types of process chambers 112 may be employed in the system 100. For example, a "batch" type process chamber 112 can simultaneously support multiple workpieces 114 on a rotating support structure, wherein the workpieces 114 are rotated through the path of the ion beam 104 until all the workpieces 114 are completely implanted. A "serial" type process chamber 112, on the other hand, supports a single workpiece 114 along the beam path 106 for implantation, wherein multiple workpieces 114 are implanted one at a time in serial fashion, with each workpiece being completely implanted before implantation of the next workpiece begins. The system 100 may also include a scanning apparatus (not shown) for moving the ion beam 104 with respect to the workpiece 114, or the workpiece with respect to the ion beam.

Ion sources in ion implanters typically generate the ion beam 104 by ionizing within the source chamber 102 a source gas, a component of which can be a desired dopant element, and extracting the ionized source gas in the form of the ion beam. The ionization process is effected by an exciter which may take the form of a thermally heated filament, a filament heating a cathode (indirectly heated cathode "IHC"), or a radio frequency (RF) antenna.

Figure 2:
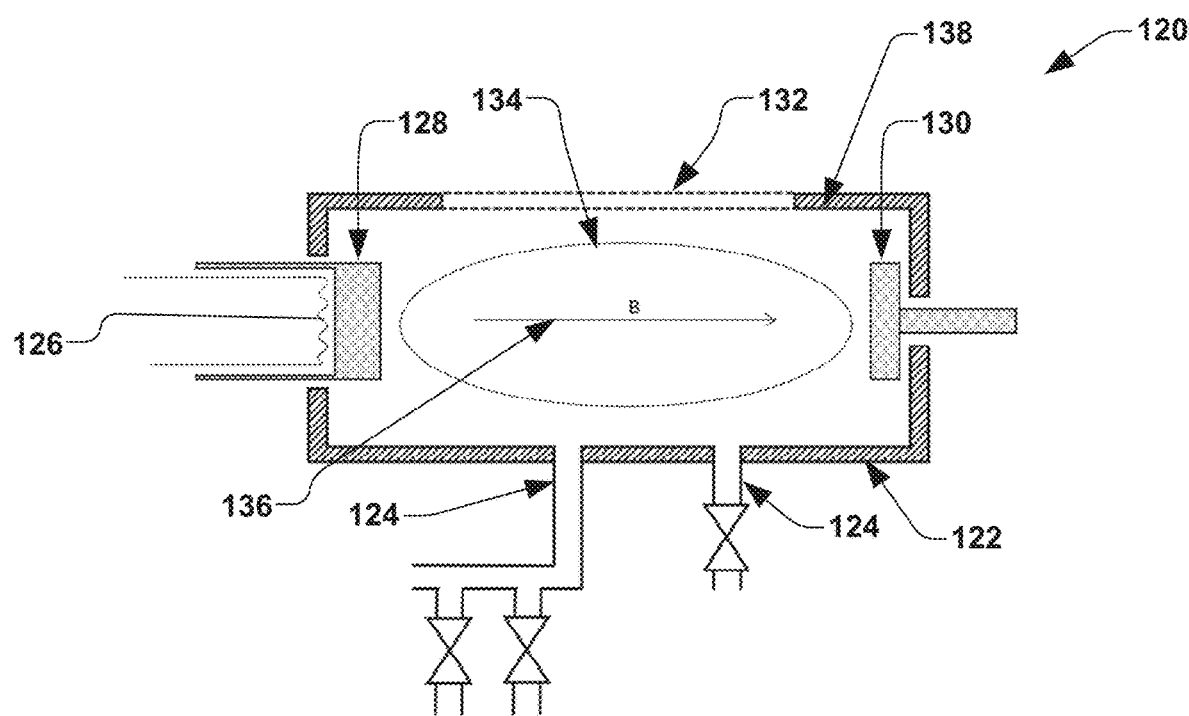
FIG. 2 is a schematic illustrating an exemplified indirectly heated cathode ion source in accordance with one example of the disclosure.

Since the ion sources of ion implanters are commonly of the IHC-type, this type of ion source is described here and by the schematic in FIG. 2. An IHC ion source 120, for example, comprises a source chamber 122, one or more gas inlets 124, a filament 126, a cathode 128 and a repeller 130 that are positioned opposite of one another in the source chamber, and an aperture 132. In addition, a source magnet (not illustrated) provides a magnetic field 136 generally along axis between the cathode 128 and repeller 130. During operation of an IHC ion source 120, the filament 126 is resistively heated to temperatures high enough to emit electrons, which are in turn accelerated to bombard the cathode 128 which is maintained at a potential that is positive with respect to the filament.

The electron bombardment heats the cathode 128 to temperatures high enough for it to thermally emit electrons into the source chamber 122 which is held at a potential that is positive with respect to the cathode 128 to accelerate the electrons. The magnetic field 136 helps confine the electrons along the field lines between the cathode 128 and repeller 130 in order to reduce the loss of electrons to chamber walls 138 of the source chamber 122. The loss of electrons is further reduced by the repeller 130 which is typically at the potential of the cathode 128 to reflect electrons back toward the cathode. The excited electrons ionize a source gas which is fed into the chamber through the gas inlet 124, generating a plasma. Ions are extracted through the aperture 132 and electrostatically accelerated to form a high energy ion beam by an electrode positioned outside the source chamber 122.

Examples of elements which are commonly implanted of which the source gas is comprised can include carbon, boron, phosphorus, arsenic, germanium, silicon, amongst others. Of increasing interest is the use of carbon, which can be utilized in many implant steps, such as material modification. The most common precursor source gases for carbon implants include carbon dioxide and carbon monoxide.

In constructing the ion source chamber 102 illustrated in FIG. 1, refractory metals such as tungsten and molybdenum are commonly used to form the cathode electrodes and interior wall surfaces of the chamber 102. During generation of the carbon ions utilizing a carbon-containing material, carbon atoms are generated in the ion chamber, and react with the material from which the electrodes, the chamber liners, chamber body and arc slit are constructed and can poison the chamber 102. Additionally, carbonaceous residue has a tendency to build up on these surfaces and detrimentally affect the efficiency and lifetime of the ion source.

Recently, significant interest has been seen in using carbon as a pre-amorphizing species in ion implantation systems. Because of its low mass, it is typically difficult to amorphize with atomic carbon at conventional workpiece temperatures, unless doses far exceed $1 \times 10^{15}$ cm$^{-2}$. However, when implanting via a spot ion beam implanter, such as the Optima HDx or Purion H implanters manufactured by Axcelis Technologies of Beverley, Mass., the amorphization threshold for carbon in silicon wafers can be reduced to as low as $5 \times 10^{14}$ cm$^{-2}$ if the wafer is cooled during implantation, and the density of the carbon beam is sufficiently high. The amorphization of the silicon wafer can be performed using atomic carbon (C) implants at wafer temperatures in the range of −30° C. to −50° C. One drawback of cold implants using atomic carbon, however, is that the quantity of wafers implanted per unit of time, commonly known as wafers per hour (WPH), is reduced.

Further, reducing the temperature of the workpiece during ion implantation has the effect of minimizing the "self-annealing" component of the implant on the crystalline lattice, wherein a relaxation of damage occurs in a very short period of time after the ions penetrate into the lattice structure of the wafer. The diffusion process is also sensitive to substrate temperature. Reducing or eliminating self-annealing results in a larger net displacement of atoms and altered damage profile, thus leading to the formation of a thicker amorphous layer and reduced end-of-range (EOR) damage that can be responsible for device leakage.

An alternate approach is to use molecular carbon at a higher energy in order to achieve the similar effect of atomic carbon (C) amorphization of the silicon crystals, but at the ambient temperature. The material damaging physics are similar after solid phase epitaxial regrowth at elevated temperatures, and end-of-range dislocation loops can be diminished and repaired. Other improvements such as improved solid phase epitaxial regrowth during anneal, a sharper amorphous/crystalline boundary, and reduced dopant movement from transient enhanced diffusion (TED) can also be attained.

The use of carbon molecules, such as toluene ($C_7H_8$), for damage engineering in semiconductor processing avoids the added expense and complexity of having to cool the substrate to sub-zero temperatures while implanting large molecules, such as $C_7$. Due to the size of the toluene molecule, the impact at predetermined energies will amorphize the crystalline structure of the semiconductor workpiece, thus resulting in a thicker damaged layer and improved device performance.

This present disclosure provides a system and a method for improving ion source performance when operating the ion source to generate molecular carbon ions for implanting into a workpiece. One problem previously encountered when generating molecular ions in an IHC ion source is that the molecular ions can dissociate due to the high temperature and high electron densities and energies that are present. Dissociation of the carbon containing molecules negatively effects two aspects of ion source performance. First, the molecular ion beam current is limited by dissociation of the desired molecular ions or smaller fragment ions. Second, carbon can deposit on the interior of the source chamber, where it tends to accumulate. Such carbon deposits can bridge electrically insulating gaps and/or coat insulators resulting in an electrical short and thus source failure.

The present disclosure provides a system and a method to extend the lifetime of an ion source when generating molecular carbon ions. In one example, a carbon source material is fed into an ion source with an oxidizing co-gas that oxidizes the carbon deposits which form in the ionization chamber. In one example, a carbon containing molecule which is especially stable is employed as a carbon source material.

For example, aromatic carbon molecules (e.g., toluene or p-xylene) provide molecular stability and may be used as source materials, such as disclosed in commonly-owned U.S. Pat. No. 8,350,236 to Lee et al., the contents of which are incorporated by reference herein, in its entirety. Further, the contents of commonly-owned U.S. Pat. No. 10,170,286 to Colvin et al., is incorporated by reference herein, in its entirety.

Figure 3:
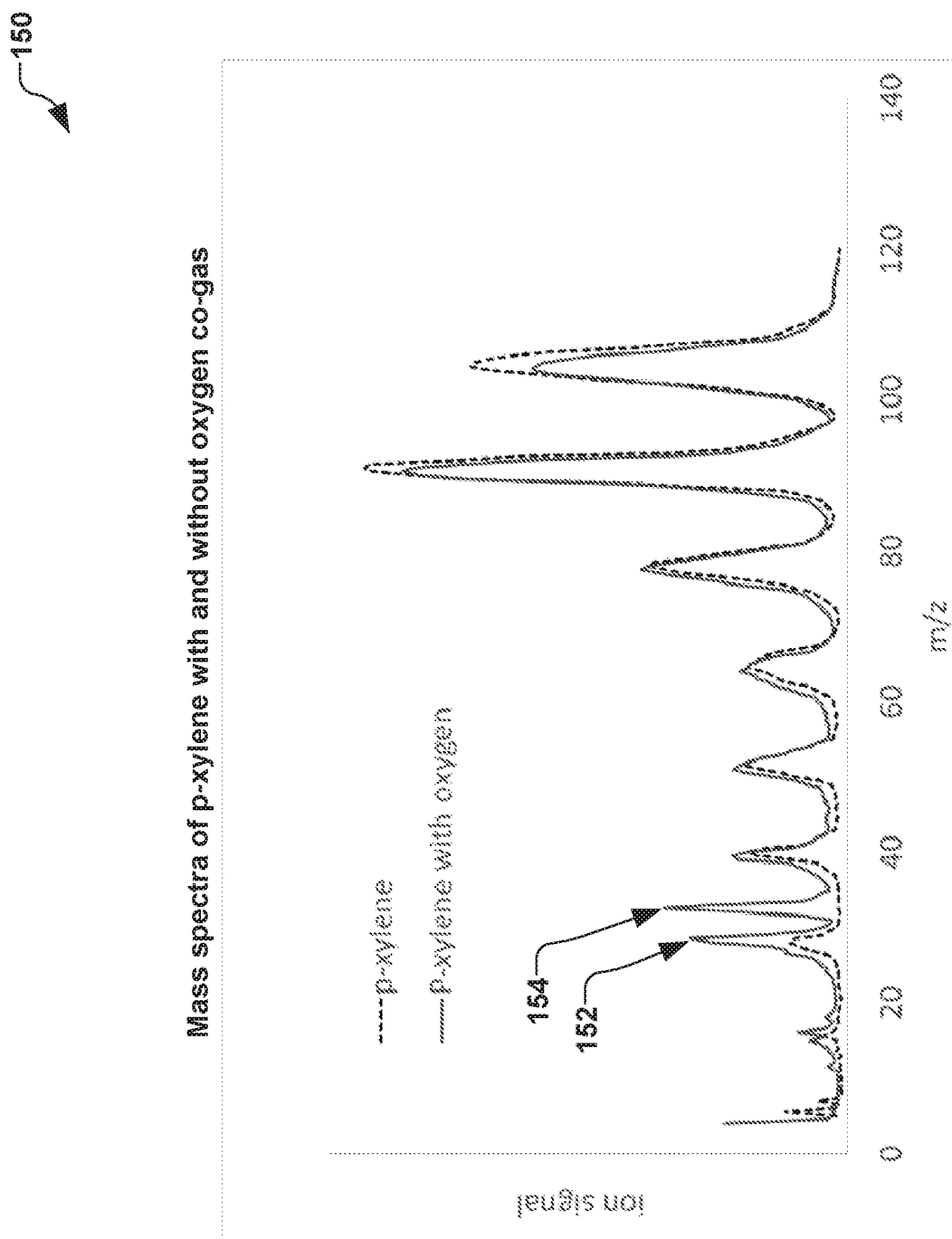
FIG. 3 is a graphical representation illustrating mass spectra of molecular carbon collected using an ion source chamber in accordance with an aspect of the disclosure, whereby beam intensity is normalized to the C7 peak.

Alternatively, a compound which forms a stable molecular ion or dissociates upon ionization to form a stable molecular fragment ion may be used as a carbon source material. For example, cycloheptatriene is an example of a molecule which forms a stable ion—the tropylium cation, which is an aromatic ion. The oxidizing co-gas material, for example, is an oxidizer or a molecule which provides oxygen atoms upon dissociation in the ion source. The oxidizing co-gas can be selected from the list of $O_2$, ozone ($O_3$), $N_2O$, $NO_2$, $H_2O_2$, $H_2O$, and $CO_2$. The carbon deposits are oxidized to form CO and $CO_2$, which are gases and are exhausted through the vacuum pumps. FIG. 3, for example, shows mass spectra of p-xylene with, and without, oxygen co-gas. Peaks 152, 154 at masses 28 and 32 in the p-xylene with oxygen spectrum are due to CO and $O_2$, respectively, the former providing evidence that the amount of carbon deposits in the ion source are reduced with addition of the co-gas.

For example, the present disclosure contemplates generating molecular carbon ions in an IHC ion source using a source material of p-xylene and an oxidizing co-gas of $O_2$. In one example, the source material and the co-gas are fed into the ionization chamber by independent gas lines. The ratio of $O_2$ co-gas flow rate to p-xylene flow rate, for example, is high (e.g., greater than one), and the ion source is tuned to preferentially ionized p-xylene molecules over the $O_2$ co-gas. Additional combinations of source material and co-gas contemplated by the present disclosure are:

1. Toluene and $O_2$,
2. Cycloheptatriene and $O_2$,
3. p-xylene and $N_2O$,
4. Toluene and $N_2O$, and
5. Cycloheptatriene and $N_2O$.

Additionally, other hydrocarbons, including aromatic compounds, can be used as a molecular carbon source gas.

Figure 4A:
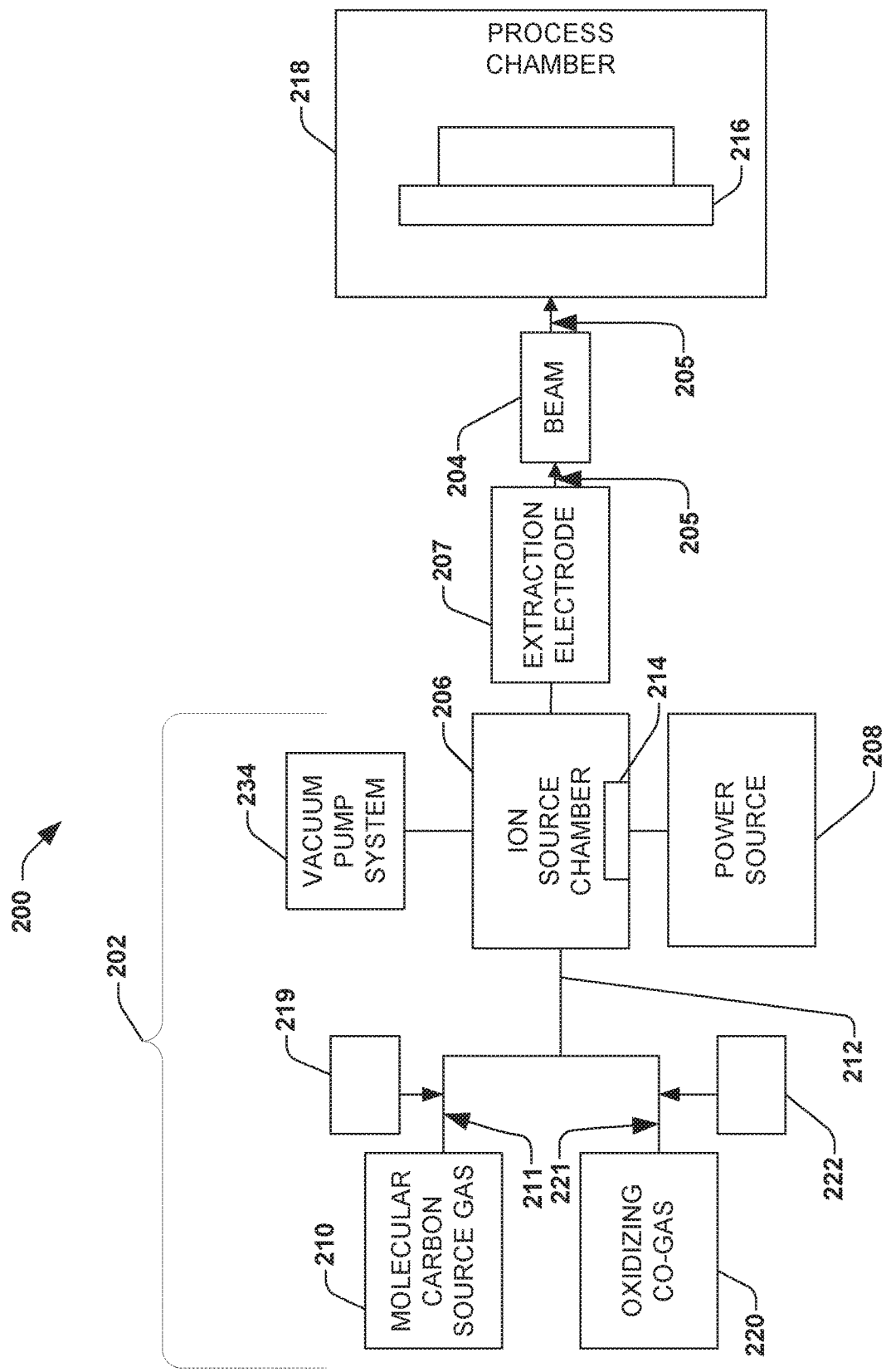
FIG. 4A is an ion implantation system illustrating one embodiment of an ion source assembly in accordance with an aspect of the disclosure.

Referring to FIG. 4A, an exemplary ion implantation system 200 is provided in block diagram form, wherein the ion implantation system is suitable for implementing one or more aspects of the disclosure. The system 200 includes an ion source assembly 202 for producing an ion beam 204 along a beam path 205. The ion source assembly 202 includes, for example, an ion source chamber 206 with an associated power source 208. The ion source chamber 206, for example, may comprise a relatively long plasma confinement chamber from which the ion beam 204 is extracted and accelerated. An extraction electrode 207 is positioned for extraction of an ion beam from the ion source chamber 206.

A source gas supply 210 containing a molecular carbon source gas 211 is coupled to the ion source chamber 206 via a common inlet 212. An exciter 214 associated with the ion source chamber 206, for example, is configured to energize the molecular carbon source gas 211, therein forming a plasma. The exciter 214, for example, may comprise a thermally heated filament, a filament heating a cathode (indirectly heated cathode "IHC"), or a radio frequency (RF) antenna operably coupled to the power source 208. The ion beam 204 is then extracted through the extraction electrode 207 and directed toward a workpiece 216 (e.g., a semiconductor wafer, such as silicon) positioned within a process chamber 218, wherein the ions are implanted into the workpiece.

The tendency for hydrocarbons to dissociate in an IHC ion source can result in deposition of atomic carbon and hydrocarbon radicals inside the ion source chamber 206 and on the extraction electrode 207 and associated optics. As such, the carbonaceous residue can build up on the interior surfaces of the ion source chamber 206, and may be highly stressed, whereby the residual carbon material can generally peel or flake off from the surfaces when the ion source chamber 206 is cooled.

Thus, in accordance with the present disclosure, a source gas mass flow controller 219 (e.g., a flow meter) controls the amount and rate of molecular carbon source gas 211 to the ion source chamber 206. Further, an oxidizing co-gas supply 220 containing an oxidizing co-gas 221 (e.g., comprising one or more of $O_2$ or $N_2O$) is further coupled to ion source chamber 206 via the common inlet 212. A co-gas mass flow controller 222 (e.g., a flow meter) controls the amount and rate of oxidizing co-gas 221 to be supplied to ion source chamber 206.

Figure 4B:
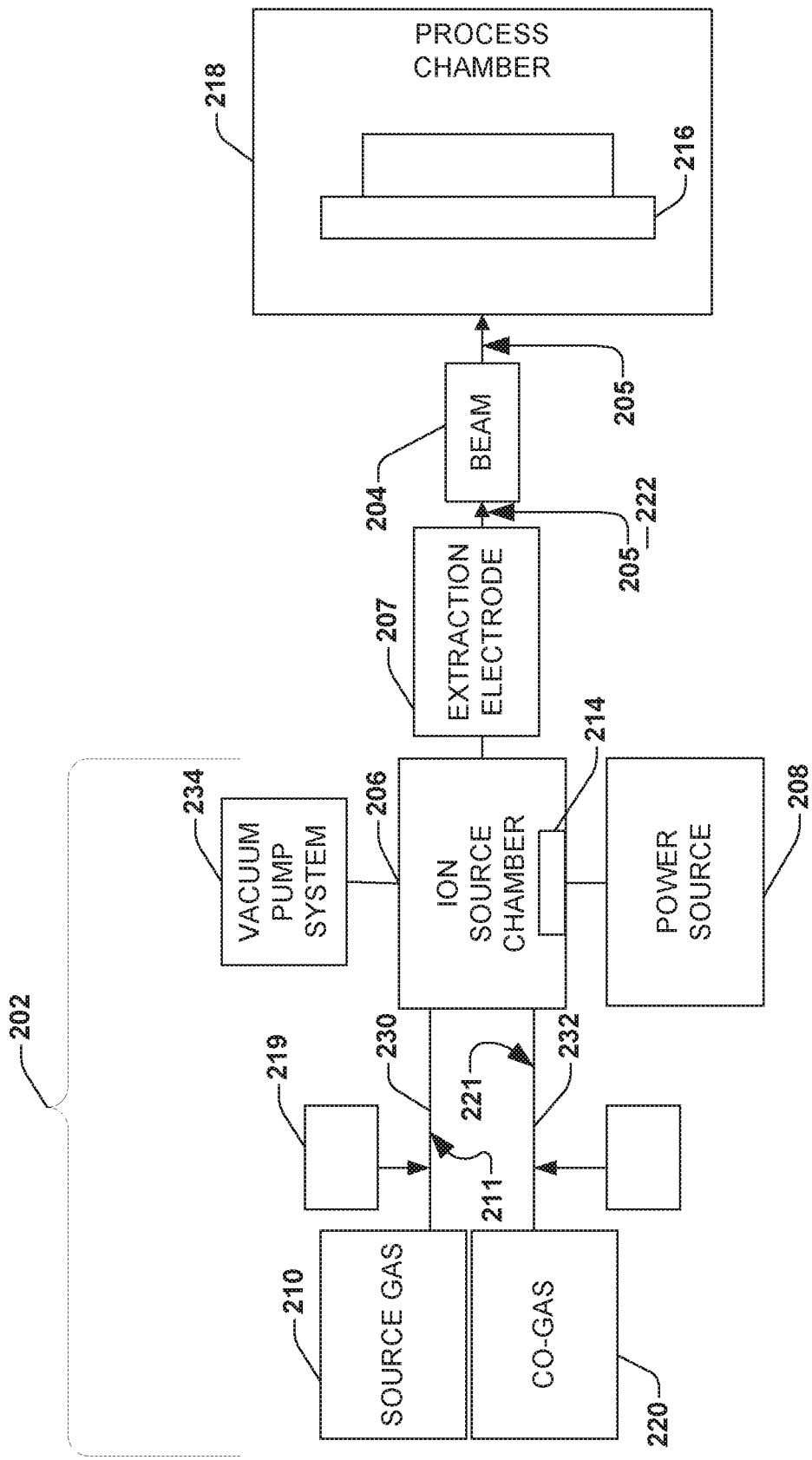
FIG. 4B is an ion implantation system illustrating a further embodiment of an ion source assembly in accordance with an aspect of the disclosure.

FIG. 4B illustrates a further embodiment in which two separate inlets 230, 232 are provided, one for molecular carbon source gas 211 and one for the oxidizing co-gas 221. The gases 211, 221 are then mixed in the ion source chamber 206. The source gas mass flow controller 219 for the molecular carbon source gas 211 and the co-gas mass flow controller 222 for the oxidizing co-gas 221 control flow of the gases through inlets 230 and 232, respectively, for entry into ion source chamber 206. The molecular carbon source gas 211 and oxidizing co-gas 221 are ionized to form a plasma of charged particles containing ions of the parent carbon molecule, molecular fragments, and oxygen. Oxygen ions and neutrals react with carbonaceous residue to form carbon monoxide (CO), carbon dioxide ($CO_2$), water molecules, and hydroxides which are removed from the chamber 206 by a vacuum pump system 234. In one example, the oxidizing co-gas 221 is comprised of oxygen, wherein a ratio of the oxidizing co-gas to the molecular carbon source gas 211 is between approximately 1.0 and 4.0. The ratio of the oxidizing co-gas 221 to the molecular carbon source gas 211, for example, can vary based on various characteristics of the ion source assembly 202 and various tuning parameters. For example, a tradeoff can exist between extending the lifetime of various components associated with the ion source chamber 206 by adding the oxidizing co-gas 221 and negative effects on properties of the ion beam 204. The specific ratio of the oxidizing co-gas 221 to the molecular carbon source gas 211 can be optimized, accordingly. For example, the ratio of the oxidizing co-gas 221 to the molecular carbon source gas 211 can range between approximately 1.5 and 3.5 for yielding a particular tradeoff, while in another example, the ratio of the oxidizing co-gas to the molecular carbon source gas can range between 2.5 and 3.5.

Figure 5:
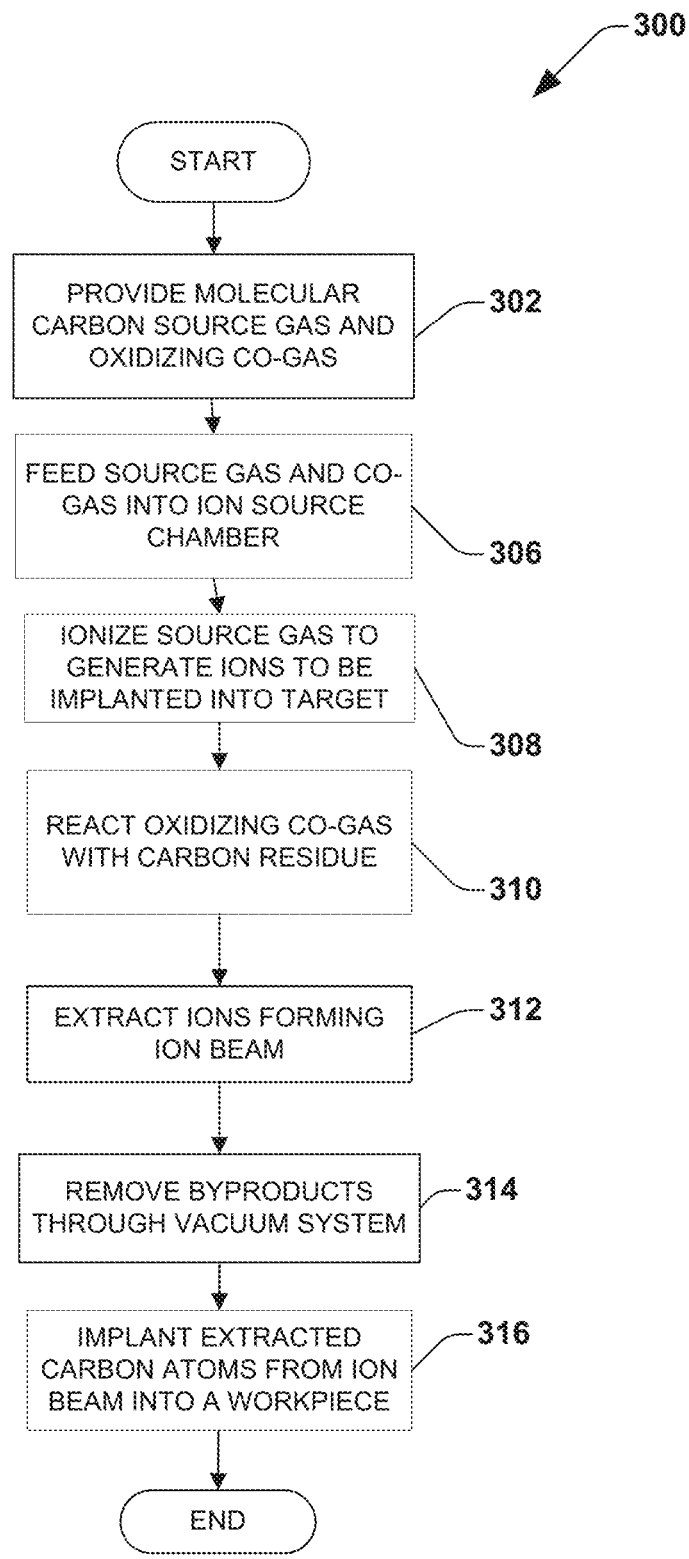
FIG. 5 is a flow diagram illustrating a method of extending a lifetime of an ion source in accordance with an aspect of the disclosure.

The present disclosure further provides a method 300 shown in FIG. 5 for extending a lifetime of an ion source. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 300 begins at block 302 wherein a molecular carbon source gas and an oxidizing co-gas are supplied. The method continues at 306 where the source gas and co-gas are fed into an ion source chamber where electrons emitted by a cathode are accelerated and ionize the gas molecules of the source gas at 308 within the ion source chamber to produce ions of the desired species. At 310, the oxidizing co-gas reacts with carbon deposits to form carbon monoxide (CO) and carbon dioxide ($CO_2$). Ions are extracted to form an ion beam at 312. The carbon monoxide and carbon dioxide are then removed by a vacuum pump system at 314. At 316, the extracted molecular carbon ions are implanted from an ion beam into a workpiece.

The selected flow rates of the molecular carbon source gas and oxidizing co-gas can vary so that the maximum amount of carbon deposits are removed without deleteriously affecting the beam current. The amount of co-gas supplied can be determined, at least in part, by analysis of the beam composition during operation.

While, for purposes of simplicity of explanation, the method 300 is depicted and described as executing serially, it is to be understood and appreciated that the present disclosure is not limited by the illustrated order, as some aspects could, in accordance with the disclosure, occur in different orders and/or concurrently with other aspects from that depicted and described herein. For instance, it is contemplated that the flow of molecular carbon source gas and oxidizing co-gas into the ion source chamber may occur simultaneously. In another embodiment, it is contemplated that the flow of these gases may occur sequentially, such that a molecular carbon source gas is introduced into the ion source chamber, followed by a flow of oxidizing co-gas into the ion source chamber. Moreover, not all illustrated features or blocks may be required to implement a methodology in accordance with an aspect the present disclosure.

Thus, the present disclosure thus contemplates forming a molecular carbon ion beam with as high of ion beam current as possible, while permitting the ion source to last as long as possible to minimize downtime. The present disclosure provides an oxidizer to oxidize the carbon, especially $O_2$ and ozone, and form CO and $CO_2$ that can be pumped away to reduce the amount of carbon deposits on the surface (e.g., tungsten) of the cathode, repeller, and interior surfaces of the ionization chamber.

Mass spectra shown in FIG. 3 illustrates two peaks 152, 154 (masses of 28 and 32, which are carbon monoxide and oxygen) using p-xylene with oxygen that aren't present in the use of p-xylene, alone. The spectra illustrate that when oxygen is introduced as the oxidizing co-gas, CO is formed and pumped away, thus providing evidence of decreasing the amount of carbon deposits, while further providing better ion source performance, indicating that the ion source will last longer than it would without the oxidizer.

The present disclosure contemplates using a stable carbon molecule, such as an aromatic carbon molecule, or one that forms a stable (aromatic) ion in the plasma. Specific molecules contemplated are cycloheptartriene, toluene, and par-axylene (p-xylene). Thus, the present disclosure contemplates a "stable carbon molecule" or aromatic carbon molecule with an oxidizer. The present disclosure contemplates carbon molecules that form an aromatic ion, even if the original molecule, itself, is not aromatic. The present disclosure, for example, is directed to a carbon implant, whereby the oxidizing co-gas provides in-situ cleaning of surfaces inside the ion source. Tuning of the ion source, for example, can be utilized to favor higher beam current for the molecular ion or fragment ions arising from the ionization.

Although the disclosure has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising." Additionally, the term "exemplary" is intended to indicate an example and not a best or superior aspect or implementation.

The invention claimed is:

1. An ion source assembly for improving ion implantation performance, the ion source assembly comprising:
    an ion source chamber;
    a source gas supply containing a molecular carbon source gas comprising p-xylene and configured to provide the molecular carbon source gas to the ion source chamber;
    a source gas flow controller configured to control a flow of the molecular carbon source gas to the ion source chamber;
    an excitation source configured to excite the molecular carbon source gas, therein forming carbon ions and radicals;
    an extraction electrode configured to extract the carbon ions from the ion source chamber, therein forming an ion beam;
    an oxidizing co-gas supply configured to provide an oxidizing co-gas to the ion source chamber;
    an oxidizing co-gas flow controller configured to control a flow of the oxidizing co-gas to the ion source chamber, wherein the oxidizing co-gas is configured to decompose within the ion source chamber and react with carbonaceous residues and atomic carbon from the molecular carbon source gas in the ion source chamber, therein forming carbon monoxide and carbon dioxide within the ion source chamber; and
    a vacuum pump system configured to remove the carbon monoxide and carbon dioxide from the ion source chamber, wherein deposition of atomic carbon within the ion source chamber is reduced and a lifetime of the ion source chamber is increased.

2. The ion source assembly of claim 1, wherein the oxidizing co-gas comprises one or more of $O_2$, $O_3$, $N_2O$, $NO_2$, $H_2O_2$, $H_2O$, and $CO_2$.

3. The ion source assembly of claim 1, wherein the source gas flow controller and oxidizing co-gas flow controller are configured to simultaneously introduce the respective molecular carbon source gas and the oxidizing co-gas into the ion source chamber.

4. The ion source assembly of claim 1, wherein the source gas flow controller and oxidizing co-gas flow controller are configured to sequentially introduce the respective molecular carbon source gas and the oxidizing co-gas into the ion source chamber.

5. The ion source assembly of claim 1, wherein the source gas flow controller and oxidizing co-gas flow controller are configured to pre-mix the respective molecular carbon source gas and the oxidizing co-gas prior to introduction into the ion source chamber.

6. The ion source assembly of claim 1, wherein the molecular carbon source gas further comprises one or more of toluene and cycloheptatriene.

7. The ion source assembly of claim 1, The ion source assembly of claim 1, wherein the oxidizing co-gas is oxygen and a ratio of the oxidizing co-gas to the molecular carbon source gas is between 1.0 and 4.0.

8. The ion source assembly of claim 1, wherein the oxidizing co-gas is oxygen and a ratio of the oxidizing co-gas to the molecular carbon source gas is between 1.5 and 3.5.

9. A method of increasing ion source lifetime in an ion implanter comprising:
   introducing a molecular carbon source gas into an ion source chamber of the ion implanter, wherein the molecular carbon source gas comprises p-xylene;
   introducing an oxidizing co-gas into the ion source chamber of the ion implanter, wherein the oxidizing co-gas comprises one or more of $O_2$, $O_3$, $N_2O$, $NO_2$, $H_2O_2$, $H_2O$, and $CO_2$;
   exciting the molecular carbon source gas within the ion source chamber to create a plasma which includes disassociated and ionized carbon;
   reacting the disassociated and ionized carbon with the oxidizing co-gas, therein producing one or more of carbon monoxide and carbon dioxide and reducing poisoning of the ion source chamber and increasing ion source lifetime; and
   removing the one or more of carbon monoxide and carbon dioxide from the ion source chamber by a vacuum pump system.

10. An apparatus for improving performance of an ion source in an ion implanter comprising:
    a molecular carbon source gas controller that controls a supply and a rate of a molecular carbon source gas to an ion source chamber, wherein the molecular carbon source gas comprises p-xylene;
    a co-gas controller that controls a supply and a rate of an oxidizing co-gas to the ion source chamber wherein the oxidizing co-gas reacts with the molecular carbon source gas and carbonaceous residue to form at least carbon dioxide, and carbon monoxide; and
    a vacuum pump system coupled to the ion source chamber, wherein the vacuum pump system is configured to remove at least the carbon dioxide and carbon monoxide from the ion source chamber, wherein chamber poisoning is reduced and ion source lifetime is increased.

11. The apparatus of claim 10, wherein the molecular carbon source gas and the oxidizing co-gas are supplied to the ion source chamber through separate inlets.

12. The apparatus of claim 10, wherein the molecular carbon source gas and the oxidizing co-gas are supplied to the ion source chamber through a common inlet.

13. The apparatus of claim 10, wherein the oxidizing co-gas comprises one or more of $O_2$, $O_3$, $N_2O$, $NO_2$, $H_2O_2$, $H_2O$, and $CO_2$.

14. The apparatus of claim 10, wherein the molecular carbon source gas consists of p-xylene.

15. The method of claim 9, further comprising introducing an inert gas into the ion source chamber and ionizing the inert gas, therein generally preventing a cathode surface associated with a cathode of the ion source chamber from oxidizing.

16. The method of claim 9, wherein the molecular carbon source gas and the oxidizing co-gas are introduced simultaneously into the ion source chamber.

17. The method of claim 9, wherein the molecular carbon source gas and the oxidizing co-gas are introduced sequentially into the ion source chamber.

18. The method of claim 15, wherein the inert gas comprises argon.

19. The ion source assembly of claim 1, wherein the molecular carbon source gas consists of p-xylene.

20. The method of claim 9, wherein the molecular carbon source gas consists of p-xylene.

* * * * *